United States Patent
Yasuda et al.

(10) Patent No.: US 6,732,583 B1
(45) Date of Patent: May 11, 2004

(54) SENSOR ELEMENT AND ITS MANUFACTURING METHOD

(75) Inventors: Naoki Yasuda, Tokyo (JP); Tatsuya Fukami, Tokyo (JP); Motohisa Taguchi, Tokyo (JP); Yuji Kawano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/030,426

(22) PCT Filed: May 15, 2000

(86) PCT No.: PCT/JP00/03077

§ 371 (c)(1),
(2), (4) Date: Apr. 1, 2002

(87) PCT Pub. No.: WO01/88482

PCT Pub. Date: Nov. 22, 2001

(51) Int. Cl.$^7$ .............................. G01F 1/68; B32B 9/00
(52) U.S. Cl. .......................... 73/204.26; 73/204.25; 324/252; 324/207.21; 428/447; 428/450; 427/515
(58) Field of Search .................. 428/447, 450; 73/204.26, 204.25; 324/252, 207.21; 427/515

(56) References Cited

U.S. PATENT DOCUMENTS 6,426,620 B1 * 7/2002 Taguchi et al. ......... 324/207.21
6,448,624 B1 * 9/2002 Ishio et al. ................. 257/417

FOREIGN PATENT DOCUMENTS

| | | | |
|---|---|---|---|
| GB | 2322452 | * | 8/1998 |
| JP | 5-121793 | | 5/1993 |
| JP | 08-78755 A | * | 3/1996 |
| JP | 08-178768 A | * | 7/1996 |
| JP | 09-304127 A | * | 12/1998 |
| JP | 10-319597 A | * | 12/1998 |

OTHER PUBLICATIONS

Machine translation corresponding to Murata MFG. Co. Ltd, JP 8–78755 from Japan Patent Office, copyright 1998, 2000. http://www1.ipdl.jpo.jp/PA1/cgi–bin/PA1DETAIL (Dec. 2002) 4 pages.*

Machine translation corresponding to Mitsubishi Electric Corp, JP 10–103597 from Japan Patent Office, copyright 1998, 2000, http://www1.ipdl.jpo.go.jp/PA1/cgi–bin/PA1DETAIL (Dec. 2002) 3 pages.*

Database Derwent on East, week 200045, London: Derwent Publications, Ltd. AN 1996–214884, Class S01 JP 08–78755 A (Murata MFG) abstract.*

Database Derwent on East, week 19911, London: Derwent Publications, Ltd. AN 1999–085809, Class A26 JP 10–319597 A (Mitsubishi Electric Corp) abstract.*

\* cited by examiner

*Primary Examiner*—Daniel S. Metzmaier
(74) *Attorney, Agent, or Firm*—Leydig, Voit & Mayer, Ltd.

(57) ABSTRACT

The present invention provides a sensor element having a sensor substrate and a sensing portion supported by the sensor substrate. A resin film is provided between the sensor substrate and the sensing portion. The resin film has a high heat resistance to the temperature of the fabrication process and the use of sensor element, has excellent coverage of a three-dimensional structure, has a flat surface, applies a low stress to the sensing portion, is formed at low temperature, and prevents the sensing portion from being adversely affected in its fabrication process.

12 Claims, 5 Drawing Sheets

SENSOR ELEMENT AND ITS MANUFACTURING METHOD

TECHNICAL FIELD

The present invention relates to a sensor element, particularly to a sensor such as a magnetoresistance sensor, an air flow sensor, an acceleration sensor, a pressure sensor, a yaw rate sensor, an image sensor, or the like, having a sensor face.

BACKGROUND ART

As a sensor element for controlling the running of vehicles, there have been used an acceleration sensor, a yaw rate sensor, a pressure sensor, an air flow sensor, a magnetoresistance sensor or the like. Among them, the air flow sensor for detecting a flow rate of gasoline is in such a constitution that, for example, temperature variation at the sensing portion in which resistance wiring is embedded caused by contacting the flow path of gasoline-containing gas is detected by the change of resistance of the resistance wiring whereby the flow rate of the gasoline-containing gas can be detected. The sensing portion is formed on a lower supporting film comprising an inorganic material such as a silicon nitride film supporting the sensing portion. The inorganic material is usually formed in a sputtering process, a CVD process, or a vapor deposition process and, therefore, film quality such as microscopic surface roughness and a film composition delicately changes depending upon apparatus and conditions for the formation of film. Due to the changes in the film quality as such, there are noted dispersion of several % in sensor characteristic (such as sensitivity) whereby it has been difficult to achieve a stable sensor characteristic with good reproducibility. There are other problems that, due to the stress difference between the sensing portion and the inorganic material, the sensor characteristic is deteriorated or a positional shift is caused in the resistance wiring constituting the sensing portion or a wiring on a contiguous control circuit. Particularly, in the case of a sensor in which wiring, such as resistance wiring, is used for the sensing portion, depending on the materials used for the wiring, adherence with a matrix material is significantly weak. When the sensor element is sealed by a resin, there poses a problem that the wiring is liable to experience a positional shift due to thermal or mechanical strain.

On the other hand, a magnetoresistance sensor is provided with a sensing portion comprising slender wires of magnetic metal, constituted to be capable of detecting a change in magnitude or direction of a magnetic field by utilizing a magnetoresistance effect of a magnetic metal. Such a sensing portion is formed on an lower layer insulating film comprising an inorganic material formed on a substrate as described, for example, in the Japanese Patent Laid-Open No.Hei.5-183145, or is formed directly on a glass substrate as described, for example, in the Japanese Patent Laid-Open No.Hei.10-270775. Therefore, like in the case of the above-mentioned air flow sensor, there are problems of dispersion of sensor characteristic and positional shift of the wiring or the like.

Further, in the conventional magnetoresistance sensor, an inorganic material such as silicon nitride film is formed as an interlayer insulating film on the outermost surface of the control circuit and, accordingly, there is a problem that, when it is attempted to make the size of the sensor element smaller by layering of the sensing portion and the surge resistance protecting from surge current, unevenness of the control circuit remains on the surface of the interlayer insulating film whereby layering the sensing portion on its surface is not possible and it is necessary to form the control circuit and the sensing portion on the same plane causing the area of the sensor element large. Further, even if the sensing portion and the control circuit are layered, it is still necessary that the sensing portion is formed on a flat surface but, since the surface of the interlayer insulating film is not flat, there is a problem that the region where the sensing portion can be formed is restricted and accordingly that the area of the sensor element becomes large.

The present invention has been achieved under such circumstances and is particularly to provide a sensor element in which a sensing portion is formed on a resin film the surface of which has a good flatness, having low stress applied to the sensing portion, capable of being formed at low temperature and having no concern of effecting adverse influence to the sensing portion even in a fabrication process.

DISCLOSURE OF THE INVENTION

Thus, according to the present invention, there is provided a sensor element having a sensor substrate and a sensing portion which is supported by the sensor substrate and there is a resin film between the sensor substrate and the sensing portion.

The resin film used in the present invention has a high heat resistance to the temperature for the manufacturing process and for the use of sensor element, has an excellent coverage performance of undercoat having a three-dimensional structure whereby it is possible to make its surface flat and, in addition, has an excellent close adhesion to the undercoat and to the sensing portion. Moreover, it has a low stress being able to be made into a thick film and also has a high resistance to environment.

BRIEF DESCRIPTION OF THE DRAWINGS

FIG. 3A is a plan view and FIG. 3B is a cross-sectional view along the line IIIB—IIIB of FIG. 3A.

BEST MODE FOR CARRYING OUT THE INVENTION

Figure 1A:
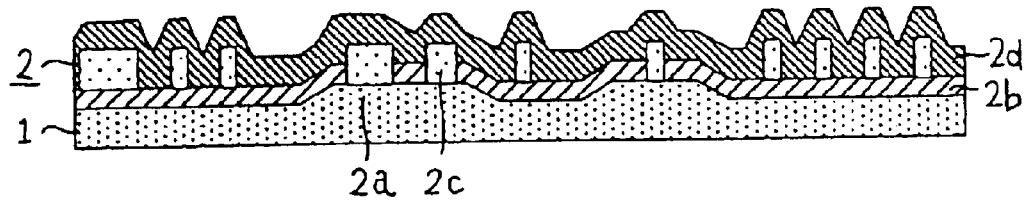
FIGS. 1A–1G are cross-sectional views illustrating an example of the structure of the magnetoresistance sensor according to the present invention and a method of fabricating thereof.

According to a sensor element of the present invention, a sensing portion for various kinds of sensors such as an acceleration sensor, a yaw rate sensor, a pressure sensor, a magnetoresistance sensor, an image sensor, or the like, is formed on a resin film. There may be constructed in such a constitution that not only a sensing portion but also a contiguous substrate or a peripheral circuit are formed on the resin film.

The resin film is any of cured films of a silicone polymer, a polyimide polymer, a polyimide silicone polymer, a polyarylene ether polymer, a bisbenzocyclobutene polymer, a polyquinoline polymer, a perfluorohydrocarbon polymer, a fluorocarbon polymer and an aromatic hydrocarbon polymer.

Those resins have a heat resistance to 200° C. or higher temperature and are able to be synthesized in a high purity.

With regard to the above-mentioned silicone polymer, the use of a silicone polymer represented by the general formula (1) or a silicone polymer represented by the general formula (2) is appropriate and each of them may be a mixture. In those silicone polymers, degassing upon a heat treatment is little and, therefore, a possibility of polluting the sensor element or the control circuit thereof is little. Particularly, the silicone polymer of the general formula (2) having a ladder-type structure has a rigid structure as compared with the silicone polymer of the general formula (1) whereby it has an excellent heat resistance after curing, has low stress upon forming the film and has higher withstand voltage. Further, since the reaction upon the heat treatment occurs at the terminal groups ($R_3$, $R_4$, $R_5$ and $R_6$), degassing upon the heat treatment is far more little.

Formula (1):

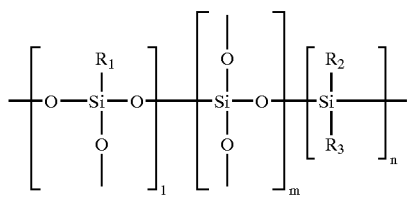

(in the formula, $R_1$, $R_2$, and $R_3$ may be either the same or different and each is an aryl group, a hydrogen atom, an aliphatic alkyl group, a hydroxyl group, a trialkylsilyl group, or a functional group having an unsaturated bond, and l, m, and n are integers and l+m+n>1, and the weight-average molecular weight is 1,000 or more).

Formula (2):

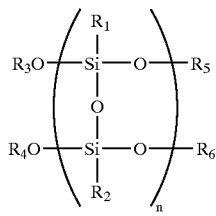

(in the formula, $R_1$ and $R_2$ may be the same or different and each is an aryl group, a hydrogen atom, an aliphatic alkyl group, or a functional group having an unsaturated bond; $R_3$, $R_4$, $R_5$, and $R_6$ may be the same or different and each is a hydrogen atom, an aryl group, an aliphatic alkyl group, a trialkylsilyl group, or a functional group having an unsaturated bond, and n is an integer and at least 1, and the weight-average molecular weight is 1,000 or more).

The silicone polymer includes that which is cured upon crosslinking by light such as ultraviolet ray and its appropriate examples include that of the above formula (1) where 1% or more of the substituents $R_1$, $R_2$ and $R_3$ is a functional group having an unsaturated bond and that of the above formula (2) where 1% or more of the substituents $R_1$, $R_2$, $R_3$, $R_4$, $R_5$ and $R_6$ is a functional group having an unsaturated bond. The functional group having an unsaturated bond is a reactive group for briding polymer molecules by crosslinking reaction or radical reaction, although an alkenyl group, an alkylacryloyl group, an alkylmethacryloyl group or styryl group is preferred, the said functional group is not limited thereto. The functional groups having an unsaturated bond may be introduced by a single thereof or may be introduced as a mixture of two kinds or more thereof. Silicone polymer having such a photocrosslinking performance is advantageous in fabricating a sensor element in view of capable of progressing curing reaction at low temperature with light as driving force by itself or by combining with a photocrosslinking agent, a photoinitiator or a photosensitizer and capable of reducing temperature applied to the control circuit or the like formed beneath the resin film or capable of carrying out self-patterning without using resist.

The silicone resin film according to the present invention can be formed by coating a solution of silicone polymer shown by the general formula (1) and/or general formula (2), so-to-speak varnish and heating and curing thereof. As a solution of such silicone polymer, a solvent solution of an alcohol type, a ketone type, an ether type, a halogen type, an ester type, a benzene type, an alkoxybenzene type or a cyclic ketone type is appropriate. Silane coupling agent for improving the adhesion with surface of the sensing portion, polymerizable monomer for improving the density of cured film or polymerization initiator, crosslinking agent, sensitizer or polymerization inhibitor for improving the stability upon preservation or the like may be added to the solution of the silicone polymer. Particularly, when there is used silicone polymer having photocrosslinking performance, there may be added photosensitive crosslinking agent, photopolymerization initiator, photosensitizer or the like as mentioned above. Photosensitive crosslinking agent and photopolymerization initiator are additives for inducing the curing of film by a radical reaction or a crosslinking reaction and as a photosensitive crosslinking agent, there are pointed out photosensitive compounds forming radical active species by light irradiation such as aromatic azide compounds, aromatic bisazide compounds, iminoquinonediazide compounds, aromatic diazo compounds, organic halogen compounds or the like, as a photopolymerization initiator, there are pointed out carbonyl compounds, dicarbonyl compounds, acetophenone, benzoin ether, acyl phosphineoxide, thioxanthone, aminocarbonyl compounds, nitrogen-containing compounds or the like. The silicone polymer shown by the general formula (2) containing such additives is described in the Japanese Patent Laid-Open No.Hei.10-319597 and such a polymer may be used.

Although the temperature for curing treatment may vary depending upon the type of polymer, heat resistant temperature of the sensing portion or heat resistant temperature of the sensor element itself before forming the protective film or the like, it is usually suitable to be from 100° C. to 400° C. and, especially when the above-mentioned photocrosslinking polymer is used, the curing treatment can be carried out at a relatively low temperature of from 100° C. to 250° C.

The resin film which is formed under the sensing portion of the sensor element of the present invention is characterized in that it is a cured film of a polymer having a weight-average molecular weight of not more than 100,000 among the above-mentioned polymers. Resin having a low weight-average molecular weight has a melting point and, therefore, when it is subjected to a heat treatment at the temperature near the melting point, a high fluidity (reflow property) is available. Accordingly, when a polymer solution is coated and subjected to a heat treatment at the temperature near the melting point (i.e., at the temperature which is not lower than a fusing temperature and is lower than a curing temperature of the polymer), the polymer film is fused and flows showing an improvement in stopgap property to the difference in level on the substrate whereby it is possible to make the lower layer surface of the sensing portion in a more flat state. When a polymer having a reflow property is used in that case, any weight-average molecular weight may be acceptable although polymers having not more than 100,000 of it is preferred since they show a high reflow property.

In the case of formation of a resin film under the sensing portion, although flatness becomes high by making the film thickness thick even in the case of only one coating process, the flatness can be improved by means of a multi-layer coating of a varnish comprising two or more kinds of polymers or same type of polymer.

The flatness can be further improved especially when both of an ultrahigh-molecular polymer having a weight-average molecular weight of more than 100,000 and a polymer having a weight-average molecular weight of not more than 100,000 as the above-mentioned two or more kinds of polymers. Thus, the polymer having a low weight-average molecular weight has a melting point and a high fluidity (reflow property) as mentioned above and, therefore, stop-gap property to the difference in level on the substrate is improved and a more flat state can be achieved.

On the other hand, many of the ultrahigh-molecular polymers having a high weight-average molecular weight do not have a melting point and, although their fluidity at the heat treatment is low, their coverage performance for difference in level is good whereby, although the difference in level remains, it is still possible to coat the level difference with a good coverage and further possible to make the rectangular part smooth. Accordingly, when the polymers having different properties as such are jointly used, the part having a difference in level can be made in a more flat state. Incidentally, in the case of a polymer having no reflow property, any weight-average molecular weight will do and that having an ultrahigh molecular weight of more than 100,000 is particularly preferred since it shows a low reflow property.

When, for example, a polymer where aryl group is introduced into 20% or more of the substituents ($R_1$, $R_2$ and $R_3$) of the side chains of the above-mentioned general formula (1) or a polymer where aryl group is introduced into 20% or more of the substituents ($R_1$ and $R_2$) of the side chains of the above-mentioned general formula (2) is used as an ultrahigh-molecular polymer of more than 100,000, resistance to crack is improved and formation of thick film of more than 1 $\mu$m is possible.

During the formation of the resin film comprising the two kinds of polymers having different weight-average molecular weight, it is possible to improve the flatness even when any of the two is firstly formed but, since the resin film comprising a low-molecular polymer has a low resistance to crack and is difficult to form a thick film, it is preferred to carry out in such a manner that the resin film comprising high-molecular polymer is firstly formed and, after the difference in level is reduced to some extent, the resin film comprising low-molecular polymer is formed in a thickness of less than the limit for crack generation because that improves the flatness.

Now the sensor element of the present invention will be illustrated by referring to the attached drawings.

Figure 1B:
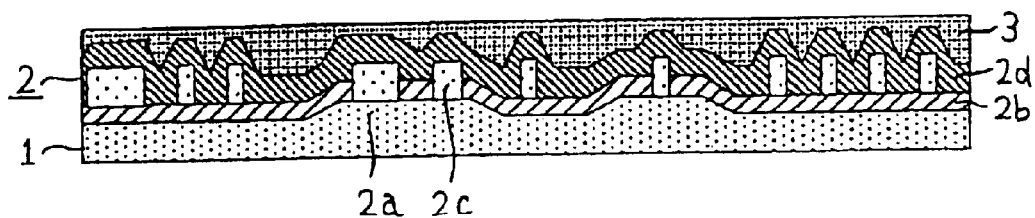
Figure 1C:
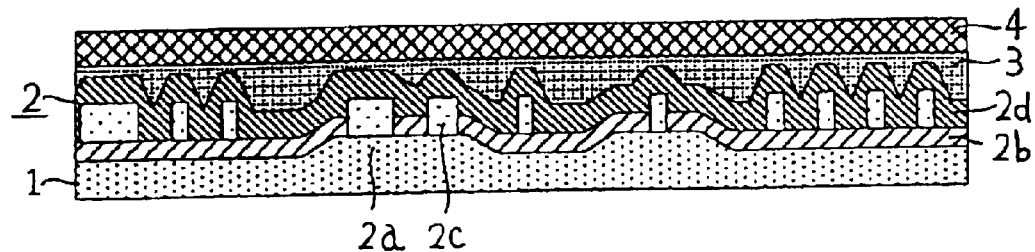
Figure 1D:
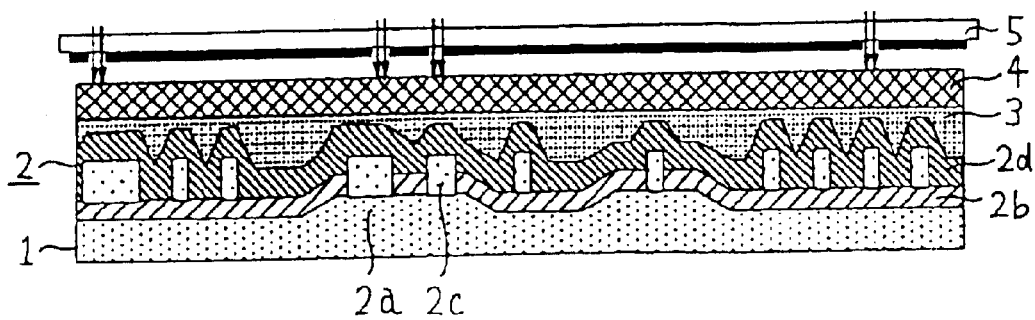
Figure 1E:
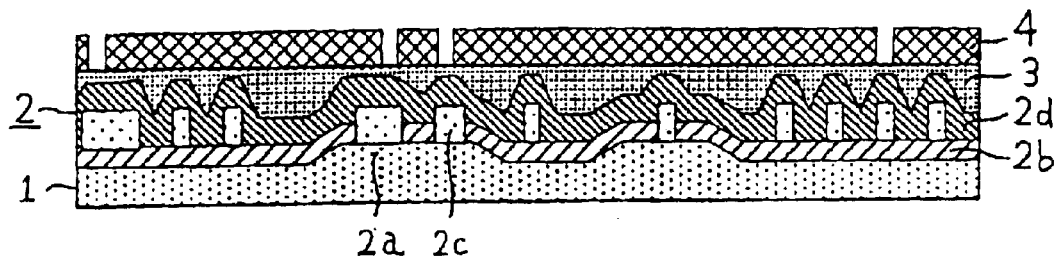
Figure 1F:
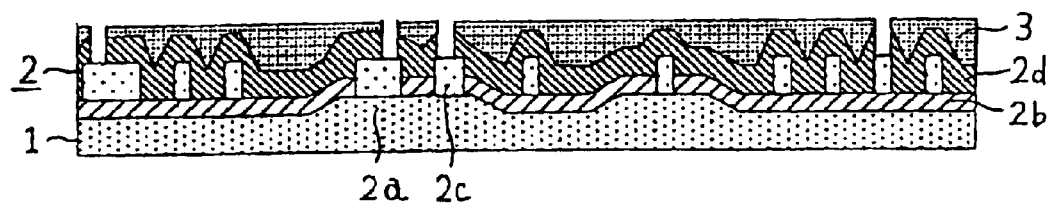
Figure 1G:
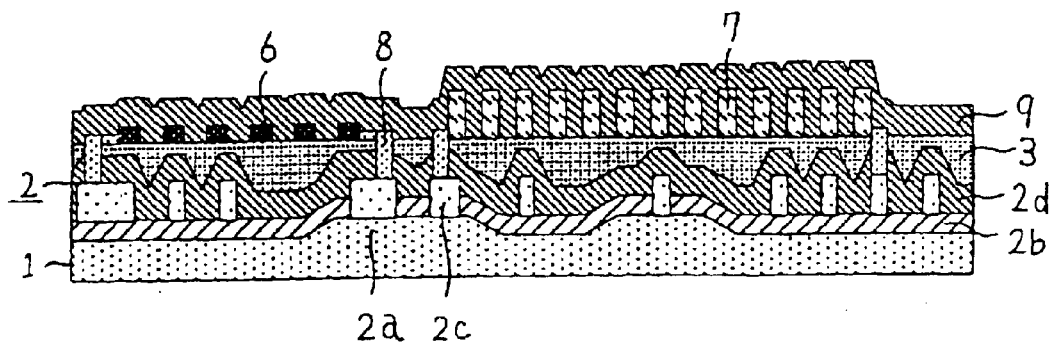

FIG. 1G is a cross-sectional view illustrating an example of the magnetoresistance sensor according to the present invention. There is a resin film 3 between a sensor substrate 1 where a control circuit 2 of the magnetoresistance sensor is formed and a sensing portion composed of fine wiring 6. The control circuit 2 is usually constituted by a bipolar IC and is composed of lower wiring 2a formed on the surface side of the sensor substrate 1, lower layer insulating film 2b comprising PSG or the like, upper wiring 2c formed on the lower layer insulating film 2b and interlayer insulating film 2d comprising inorganic film (silicon nitride film, silicon oxide film, etc.) formed on such surfaces by sputtering or CVD, and the like. On the control circuit 2, there is formed a resin film 3 and, on the resin film 3, there is formed a fine wiring 6 comprising magnetic metal showing a magnetoresistance effect. The fine wiring 6 has a fine wiring pattern comprising a plurality of wiring patterns being adjacent each other. In addition, a surge resistance 7 comprising AlSi for the protection of transistor and electric source to surge current is also formed on this resin film 3. Fine wiring 6 and upper wiring 2c of control circuit and also surge resistance 7 and upper wiring 2c of control circuit are connected by a connecting metal 8. On those surfaces, there is formed a passivation film 9 comprising inorganic film (silicon nitride film, silicon oxide film, etc.) formed by means of sputtering or CVD.

FIGS. 1A–1G are cross-sectional views illustrating an example of the method for the manufacture of the magnetoresistance sensor according to the present invention.

First, on the surface side of the sensor substrate 1, there is formed a control circuit 2 by a usual manufacturing process for bipolar IC (FIG. 1A).

Varnish prepared by dissolving a silicone polymer, a polyimide polymer, a polyimide silicone polymer, a polyarylene ether polymer, a bisbenzocyclobutene polymer, a polyquinoline polymer, a perfluorohydrocarbon polymer, a fluorocarbon polymer, an aromatic hydrocarbon polymer or a silicone polymer represented by the above-mentioned general formula (1) and/or general formula (2) in a solvent such as an alcohol type, a ketone type, an ether type, a halogen type, an ester type, a benzene type, an alkoxybenzene type, a cyclic ketone type, etc. is coated on the control circuit 2 in the thickness of 10 nm to 50 $\mu$m and subjected to a heat treatment on a hot plate at 100° C. to 400° C. to form a resin film 3 on the control circuit 2 (FIG. 1B).

After that, a positive resist 4 for i-line having a thickness of 100 nm to 20 $\mu$m is coated on the surface of the resin film 3 (FIG. 1C) and ultraviolet light (i-line) is irradiated from the upside using a mask 5 having a contact hole pattern for exposing contact part of the upper wiring 2c of the control circuit 2, bonding pad (not shown) or dicing line (not shown), whereupon the positive resist 4 for i-line of the contact hole part is exposed (FIG. 1D).

Then, after the exposure, baking is carried out and developing treatment is conducted to give a pattern of positive resist 4 for i-line having a desired pattern (FIG. 1E).

Using the pattern of the positive resist 4 for i-line as a mask, the resin film 3 and the interlayer insulating film 2d are continuously removed by means of a dry etching using a reactive ion etching apparatus or an ion beam etching apparatus to give a contact hole. With regard to the etching gas used in the reactive ion etching, although there is no limitation so far as it is a gas species which is able to etch the resin film 3, a mixed gas comprising $CF_4$, $CHF_3$, $C_4F_8$, $N_2$, $H_2$, Ar, $O_2$, etc. may be used preferably. When removal of the resin film 3 is carried out by a dry etching as such, the resin film 3 and the interlayer insulating film 2d can be continuously removed and, therefore, the process can be simplified.

After that, the positive resist 4 for i-line on the resin film 3 is subjected to a wet removal or a dry removal using reactive ion etching apparatus, ion beam etching apparatus, ashing apparatus, etc. and then post-baked at 100° C. to 450° C. using an oven or a hot plate to cure the resin film 3. As a result, the predetermined part is opened to give a resin film 3 where the surface is made flat is obtained (FIG. 1F).

On the resin film 3 are formed fine wiring 6 and surge resistance 7. Each of the fine wiring 6 and the surge resistance 7 is connected to a contact part, etc. of the upper wiring 2c of the control circuit 2 by means of a connecting metal 8 via an opening made on the resin film 3. Finally, a passivation film 9 comprising silicon nitride film or the like protecting the fine wiring 6 and the surge resistance 7 is formed to give a magnetoresistance sensor (FIG. 1G).

When the sensing portion of the above-mentioned magnetoresistance sensor is formed on the above-mentioned resin film 3, it is possible to prevent the deterioration of sensor characteristic or the positional shift of fine wiring 6 and surge resistance 7 and it is also possible to prevent the positional shift of the upper wiring 2c or the like on the control circuit 2. Further since this resin film 3 has a high withstand voltage, deterioration of sensor characteristic by electric field caused by the control circuit 2 can be prevented when a sensing portion is formed on the control circuit 2 and, moreover, malfunction of the control circuit 2 by electric field caused by the surge resistance 7 can be prevented when the surge resistance 7 is formed on the control circuit 2. The resin film 3 has a low residual stress and a buffer action and, therefore, stress from the encapsulation resin is buffered and positional shift of the fine wiring 6 and the surge resistance 7 can be prevented and malfunction of sensor element thereby can be prevented when the whole sensor element is encapsulated by an encapsulation resin. Further since it has a heat resistance durable to the process for the manufacture of sensor element and has an excellent resistance to environment, it is also effective as a protective film for the control circuit 2. Furthermore, abnormality in characteristic is not noted in the evaluation of the sensor characteristic by a pressure cooker test.

When a silicone resin film is used as a resin film 3, it is preferred that the above-mentioned interlayer insulating film 2d contains many hydroxyl groups on its surface for further improvement in adhesion to the silicone resin film.

Further, as the resin film 3, when a resin film comprising a silicone polymer of which all substituents of side chains of $R_1$, $R_2$ and $R_3$ of the above general formula (1) are hydrogen atom or aliphatic alkyl group, or a silicone polymer of which all of $R_1$ and $R_2$ in the above general formula (2) are hydrogen or aliphatic alkyl group is used, flatness of the resin film 3 is improved and compatibility of the resin film 3 with the sensing portion becomes good whereby the sensor characteristic can be improved. Hydrogen atom, methyl group and ethyl group are particularly preferred.

Furthermore, when a resin film comprising a silicone polymer where all of the terminal substituents $R_3$ to $R_6$ in the above general formula (2) are made hydrogen atom is used as the resin film 3, it is possible to improve the close adhesion to the undercoat film.

When a thick film of 1 $\mu$m or more is to be formed, it is preferred that 20% or more of $R_1$, $R_2$ and $R_3$ in the general formula (1) or 20% or more of $R_1$ and $R_2$ in the general formula (2) are aryl group such as phenyl group and, when a weight-average molecular weight of the silicone polymer is made 50,000 or more, crack-resistance of the thick film is improved whereby that is more preferred.

Since the polymer having a weight-average molecular weight of 100,000 or less has a melting point, the polymer film flows upon fusion (reflow) in the direction of the low difference in level when a heat treatment is carried out near the melting point (i.e., at the temperature which is not lower than a fusing temperature and is lower than a curing temperature of the thermosetting polymer) after coating the varnish whereby it is possible that the recess portion is efficiently embedded and that the surface of the lower layer forming the sensing portion is made in a more flat state. Since the polymer having a weight-average molecular weight of 1,000–10,000 has a very high reflow property, that can be preferably used. However, when the coated film thickness is same as or thinner than the difference in level, there may be the case where the rectangular shape of the difference in level still remains.

On the other hand, many polymers having a weight-average molecular weight of more than 100,000 has no melting point and, therefore, fluidity upon heat treatment (reflow property) is low and stopgap property is bad but the property of coating the difference in level is good and, in addition, the rectangular shape of the difference in level can be made smooth. When there is a risk that the wiring such as fine wiring 6 and surge resistance 7 formed on the resin film 3 is cut by the rectangular shape of the undercoat, the effect is significantly good when the resin film comprising the ultrahigh-molecular polymer is used.

When the difference in level of the control circuit 2 cannot be well filled in by one application of the resin film, that can be improved by coating a thick film or by a multiple coating. In the case of the multiple coating, any one of same varnish, different varnishes in viscosity and varnishes constituted by different polymer may be used. When the multiple coating is carried out however, it is necessary for the prevention of mixing with the resin film of the lower layer to carry out a post-baking for each film formation or to use a varnish prepared from a solvent by which the underlying resin film is not dissolved.

When the polymer with a high reflow property having a weight-average molecular weight of not more than 100,000 and the polymer with a low reflow property having a weight-average molecular weight of more than 100,000 as mentioned above are jointly used in the case of the multiple coating, it is possible to make the difference in level more flat.

Thus, at first, a resin film comprising a polymer with high reflow and good filling-in properties having a low weight-average molecular weight is formed whereupon, although the rectangular shape of the difference in level still remains, the difference in level can be filled in by the resin film to some extent. After that, a resin film comprising a polymer with a good coverage performance for difference in level having a high weight-average molecular weight is layered on this surface, the rectangular shape can be made smooth and the residual difference in level is filled up whereupon the more flat state can be resulted.

The order of formation of a resin film comprising a polymer having a low weight-average molecular weight and another resin film comprising a polymer having a high weight-average molecular weight may be free but, since the resin film comprising a low weight-average molecular weight has low resistance to crack and is difficult to form a thick film, the flatness is more improved when the resin film comprising a polymer having a high weight-average molecular weight is firstly formed to more or less reduce the difference in level and then the resin film comprising a low weight-average molecular weight is used to form a film thickness of not more than the limit for generation of crack.

With regard to the above sensor element, although there is no particular limitation so far as it is a sensor, there is particularly used magnetoresistance sensor, air flow sensor, acceleration sensor, pressure sensor, yaw rate sensor or image sensor as sensor element.

In place of forming a resin film on a sensor substrate where the control circuit 2 is formed on the surface, it is also possible that a resin film is formed on the sensor substrate where an insulating film is formed on the surface or that the resin film is directly formed on the sensor substrate comprising glass substrate or silicon substrate. In that case, a sensing portion is formed on that resin film as well.

In the sensing portion (fine wiring 6) in the above sensor element, although depending on a kind of the sensor, there may be used metal such as Au, Al, Ag, Bi, Ce, Cr, Cu, Co, C, Fe, Hf, In, Mo, Mg, Ni, Nb, Pb, Pt, Si, Sn, Ti, Ta, V, W, Zn, Zr or the like and alloy, oxide, nitride, silicide, sulfide, carbide, fluoride or the like comprising the metals. For example, there may be used alloy such as Al—Cu, Al—Si, Cu—Cr, Cu—Ni, Ni—Cr, Ni—Fe, Al—Si—Cu, Ni—Cr—Si, Al—Sc, Co—Cr or the like, oxide such as $Al_2O_3$, $CeO_2$, CuO, $Fe_2O_3$, $HfO_2$, MgO, $Nb_2O_5$, SiO, $SiO_2$, TiO, $TiO_2$, $Ta_2O_5$, $ZrO_2$ or the like, nitride such as AlN, $Cr_2N$, $Si_3N_4$, TiN, ZrN or the like, silicide such as $CrSi_2$, $MoSi_{2.5}$, $WSi_2$, $WSi_{0.4}$ or the like, sulfide such as ZnS, carbide such as SiC, TiC, WC or the like and fluoride such as $MgF_2$ or the like. However, these are not limited to the above-described and any material may be used so far as the material is a material necessary for fabricating the sensor.

It is also possible that, before coating the above-mentioned varnish, surface of the control circuit 2 is treated with a solution or the like containing a silane coupling agent to enhance the close adhesion of the control circuit 2 to the resin film 3.

It is further possible that, after coating the above-mentioned varnish, surface of the resin film 2 is treated with hexamethylenedisilazan or the like to enhance the close adhesion of the positive resist 4 for i-line to the resin film 3. It is furthermore possible that a reflection preventive film is formed on the positive resist 4 for i-line so that the pattern formation is precisely carried out.

In the above illustration, the positive resist 4 for i-line is used but, so far as a desired pattern formation can be formed, any of positive resist and negative resist may be used and, moreover, any of that for g ray, i-line, KrF excimer and ArF excimer may be used.

It is also possible that, before developing the resin film 3, ultraviolet ray is irradiated on whole area of the pattern of the positive resist 4 for i-line to increase the crosslinking density whereby the resistance of the developer or rinsing solution exclusively for the said resin film is enhanced.

It is further possible that, in place of a method for a continuous dry etching of the resin film 3 and the interlayer insulating film 2d, the resin film 3 is removed by a developing treatment and the interlayer insulating film 2d is removed by a dry etching. The developing treatment is carried out in such a manner that a dipping development or a spin development is conducted using the developing solution exclusively for the resin film followed by washing using a rinse solution exclusively for the resin film.

In the case of pattern formation by a reactive ion etching using an etching gas containing oxygen or in the case of removal of the positive resist 4 for i-line by an ashing apparatus, oxidation of the surface layer of the resin film 3 can be lowered when it is conducted under the condition of low pressure and low power. Especially under the low pressure condition of not more than 1 Torr and the low power condition of not more than 1 kW, oxidation of the surface of the resin film 3 can be further lowered.

While in the above-mentioned examples, a resin film 3 is formed on the control circuit 2 where an interlayer insulating film 2d is formed on the surface and is functioned especially as a stress buffering film and a flattening film, it is also possible that, since the above-mentioned polymer is in high purity, the resin film 3 comprising such a polymer is directly formed on the control circuit 2 where no interlayer insulating film 2d is formed on the surface so that it functions as a protective film as well in addition to the functions as stress buffering film and flattening film. In that case, the resin film 3 is formed by a rotary coating and, therefore, it is possible for the resin film 3 to avoid the damage by radioactive ray of the control circuit 2 caused by plasma irradiation.

Further, it is preferable that the interlayer insulating film 2d includes a large amount of hydroxyl groups at its surface to further improve the adhesion to the resin film 3.

Figure 2A:
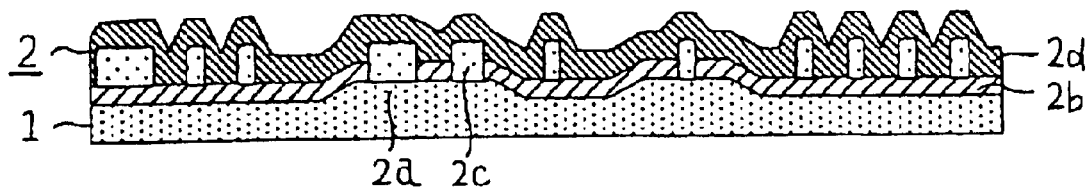
FIGS. 2A–2F are cross-sectional views illustrating another example of the structure of the magnetoresistance sensor according to the present invention and a method of fabricating thereof.
Figure 2B:
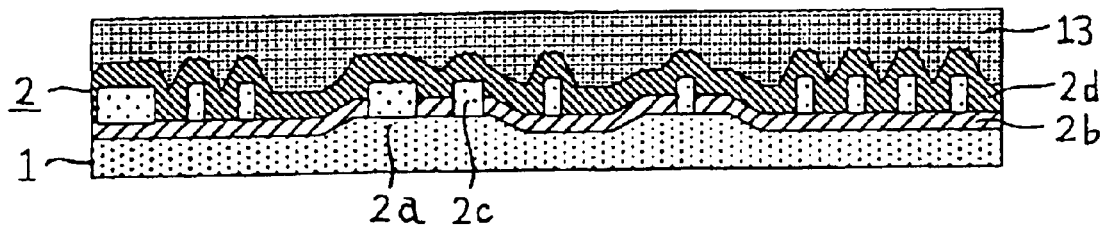
Figure 2C:
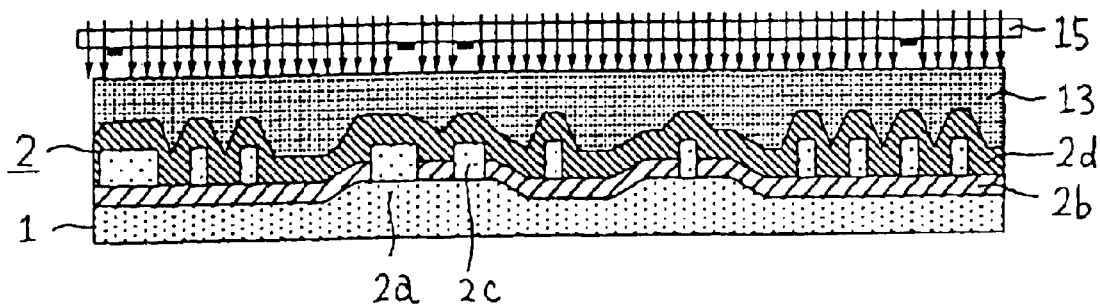
Figure 2D:
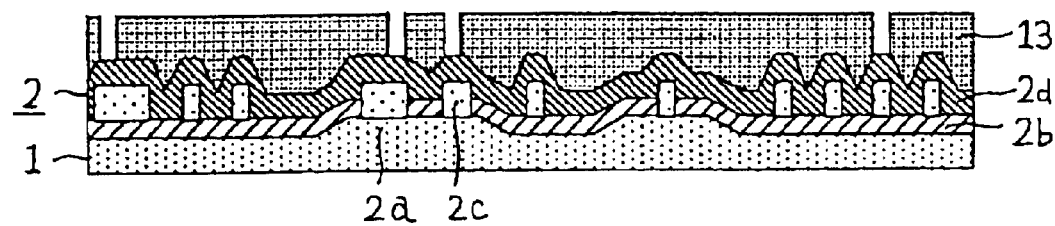
Figure 2E:
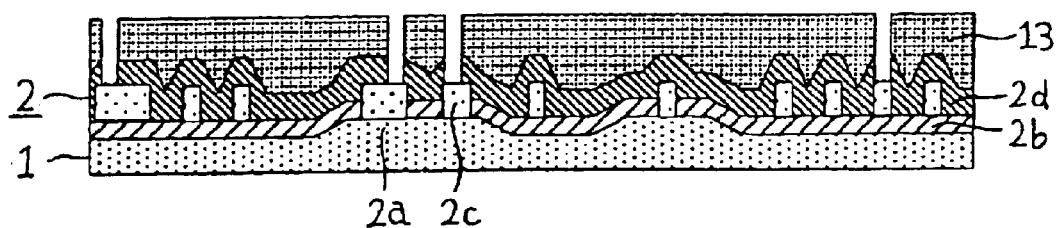
Figure 2F:
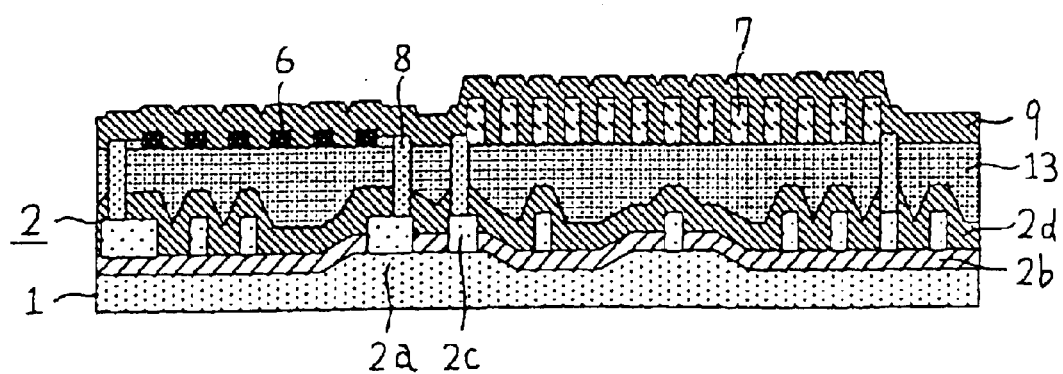

FIG. 2F is a cross-sectional view for illustrating another example of the magnetoresistance sensor according to the present invention. In the magnetoresistance sensor, there is an photocured resin film 13 between the sensor substrate 1 where the control circuit 2 is formed on the surface and the sensing portion constituted by fine wiring 6. Other constitutions are the same as those in FIG. 1.

FIGS. 2A–2F are cross-sectional views illustrating another example of the method of fabricating the magnetoresistance sensor according to the present invention. The method of fabricating the magnetoresistance sensor differs from the above-described method in that there is used a compound prepared by dissolving polymer having photocrosslinking performance in a solvent and adding a photocrosslinking agent or photopolymerization agent thereto. For example, a polyimide polymer, a silicone polymer or the like may be used for the polymer having photocrosslinking performance. A method for the formation of pattern of resin film comprising silicone polymer is described, for example, in the Japanese Patent Laid-Open No.Hei.10-319597.

Firstly, a varnish of a polymer having photocrosslinking performance is coated, by the same manner as above, on a sensor substrate 1 where the control circuit 2 is formed on its surface and subjected to a heat treatment at 100° C. to 250° C. (FIG. 2A and FIG. 2B). Then, irradiation and exposure to light are carried out from upside using a mask 15 having a desired pattern and the area of the resin film where no light is irradiated is removed by means of a developing treatment and post-baked at 100° C. to 450° C. to cure the resin film. As a result, there is prepared a flat resin film 13 where the predetermined area is opened (FIG. 2C and FIG. 2D).

By the same method as above, on the resin film 13, removal of interlayer insulating film 2b of the control circuit 2 and formation of fine wiring 6, surge resistance 7, connecting metal 8 and passivation film 9 are carried out to prepare a magnetoresistance sensor where a sensing portion is formed on the photocured resin film 13 (FIG. 2E and FIG. 2F).

It is further effective to form multiple layers so as to flatten the above resin film. In that case, although it is not necessary that all layers of the multiple layers are the resin films comprising photo-curing polymer, it is still necessary that at least the resin film of the outermost layer is a resin film comprising an photo-curing polymer. In this case, it is prefarable that the resin film and the interlayer insulating film of the lower layer are removed by means of a continuous dry etching using the resin film comprising the photo-curing polymer as a mask.

Photosensitive crosslinking agent and photopolymerization initiator are usually added to induce the reaction using light as a driving force and are decomposed by heat treatment as well to thereby cause curing reaction. The polymer is formed on the sensor element and therefor, a temperature condition of curing thereof directly effects adverse influence on the sensor characteristic, however, the polymer having high molecular weight is provided with heat resistance at 500° C. even when the polymer is not thermally cured, by adding the additives, curing temperature in forming the film can be lowered and the polymer can be baked at temperature equal to or lower than heat resistance limit temperature of the sensor element. Further, by adding the additives, photosensitivity is manifested, when a pattern needs to transcribe on the resin film, by irradiating ultraviolet ray directly to the resin film via a mask having a desired pattern and developing thereof, the pattern can be formed. Therefore, the resist pattern forming step can be dispensed with, the pattern can be transcribed in a short period of time and stably, the additives can contribute to simplification of the process and reduction of the cost.

EXAMPLE 1

Figure 3A:
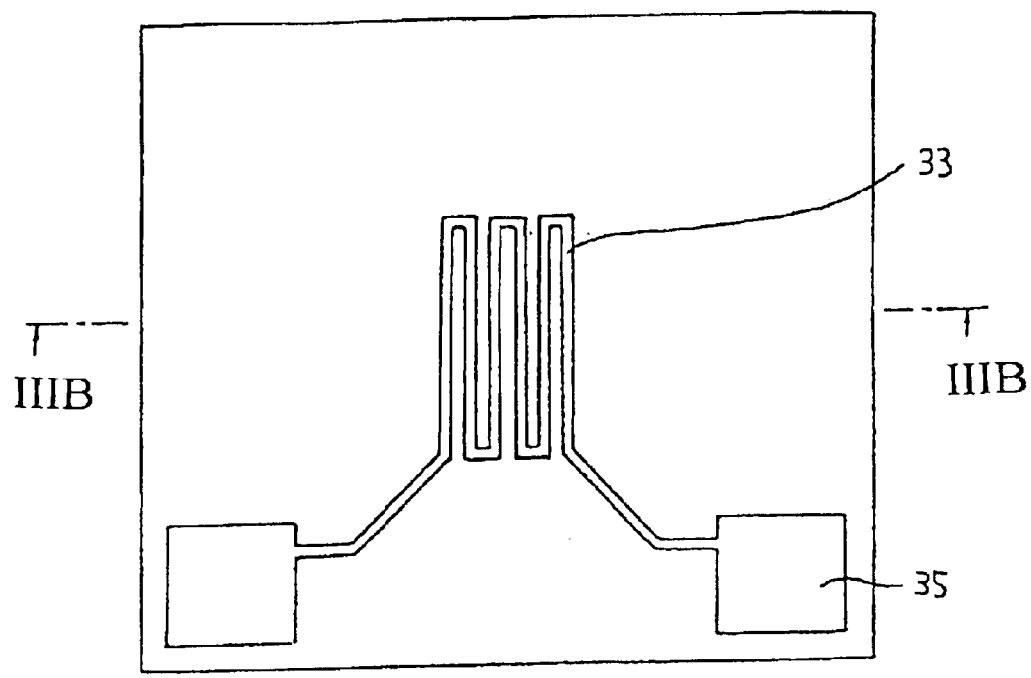
FIGS. 3A and 3B are drawings which illustrate the structure of the air flow sensor of Example 1 according to the present invention where
Figure 3B:
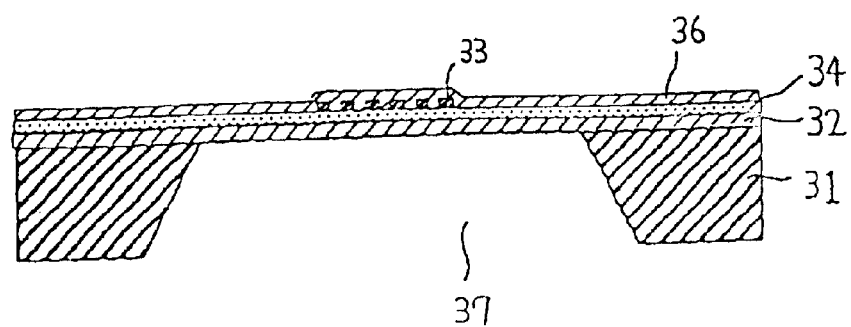

FIGS. 3A and 3B are drawings which illustrate the structure of an air flow sensor of Example 1 according to the present invention where FIG. 3A is plan view and FIG. 3B is a cross-sectional view along the line IIIB—IIIB in FIG. 3A.

In the air flow sensor according to the present invention, there is a resin film 34 between a silicon substrate 31 where the lower supporting film 32 is formed on its surface and a sensing portion constituted by a metal wire 33 comprising microfine wiring pattern in a zigzag shape. Bonding pads 35 for detecting a change in an electric resistance value is provided to connect to both ends of the metal wire 33. An upper supporting film 36 is formed on the surfaces of the metal wire 33 and the resin film 34. A recess portion 37 is provided below the sensing portion of the silicon substrate 31.

The air flow sensor detects a flow rate of a gas by detecting a heat amount of the metal wire 33 which is conducted and heated and which is deprived by depending upon the flow rate of the gas passing through the recess portion 37 by a change in the electric resistance value.

An explanation will be given of a method of fabricating the air flow sensor. First, there was formed a lower supporting film 32 comprising silicon nitride film formed by a sputtering apparatus on the front face side of a silicon substrate 31 having a thickness of about 300 µm.

Then, on the lower supporting film 32, a pattern formation of a polyimide resin film as a resin film 34 was carried out as follows.

First, a varnish (PIX-1400; manufactured by Hitachi Chemical) of a polyimide polymer dissolved in an organic solvent such as N-methylpyrrolidone, etc. was rotationally coated at the rate of 3,000 rpm onto the surface of the lower supporting film 32 comprising silicon nitride film and dried by a heat treatment on a hot plate at 120° C. for 1 minute to thereby carry out a surface treatment. Further, postbaking was carried out in an oven at 350° C. for 1 hour to thereby completely cure the varnish to thereby form a polyimide resin film 34 having a film thickness of about 2 µm.

The positive resist for i-line was rotationally coated on the polyimide resin film 34 to make the film thickness about 5 µm and normal photolithography was carried out to thereby provide a positive resist pattern for i-line for opening desired dicing lines.

Next, with the positive resist pattern for i-line as a mask, a portion of the polyimide resin film which is not protected by the positive resist for i-line was removed by a dry etching process.

The dry etching was carried out by using a reactive ion etching apparatus and using a gas having a mixture ratio of $C_4F_8/O_2$ of 3/7 as the gas for dry etching. Further, the positive resist for i-line was ashed to remove by an oxygen plasma to thereby provide a polyimide resin film 34 a predetermined portion of which was opened.

After forming the polyimide resin film 34, metal wire 33 comprising Pt which is to be a temperature sensor, bonding pads 35 and upper supporting film 36 comprising silicon nitride film were formed in this order on the polyimide resin film 34. After that, the silicon substrate 31 right below the metal wire 33 was removed by a wet etching to form a recess portion 37. Finally, the bonding pads 35 and a lead frame (not shown) were connected by a bonding wire (not shown).

According to the air flow sensor, the metal wire 33 comprising Pt which is conducted with electricity, is heated at the temperature higher than the outer air temperature by about 100° C. and the metal wire 33 comprising Pt is deprived of heat and temperature thereof is lowered by depending upon flow intensity of gas flow. Since the resistance value of the metal wire 33 comprising Pt changes depending upon temperature thereof, the deprived heat amount can electrically be detected. Since the deprived heat amount and the flow intensity of the gas flow correspond to each other in a one-to-one relationship, the flow of gas can be known.

In the case of an air flow sensor where a sensing portion is formed on an inorganic film, there is a problem that sensor characteristic varies widely and is deteriorated due to positional shift of the metal wire. However, such a problem has been solved by forming a sensing portion on the resin film and the durability test result was also within a practical level.

EXAMPLE 2

FIG. 1G is a cross-sectional view illustrating the structure of a magnetoresistance sensor of Example 2 according to the present invention. Formation of a silicone resin film as a resin film 3 on the surface of an interlayer insulating film 2d of control circuit 2 constituted by bi-polar IC was carried out by the following method.

Firstly, there were prepared a varnish (a) where a silicone polymer of the formula (1) in which all of the side chains. $R_1$, $R_2$ and $R_3$ were methyl group and a weight-average molecular weight was five thousand was dissolved in methanol to make the concentration 20% by weight and another varnish (b) where a silicone polymer of the formula (2) in which 10 mol. % of the side chains $R_1$ and $R_2$ were allyl and residues were phenyl while $R_3$, $R_4$, $R_5$ and $R_6$ were hydrogen atom (hydroxyl group) and a weight-average molecular weight was 200,000 was dissolved in methoxybenzene to make the concentration 10% by weight followed by adding 0.5% by weight (to the polymer) of γ-aminopropyl trimethoxysilane thereto.

The varnish (b) was rotationally coated at the rate of 2,500 rpm on the surface of the interlayer insulating film 2d and cured by subjecting to a heat treatment at 250° C. for 5 minutes on a hot plate. A silicone resin film having a film thickness of 1.3 µm was formed. Although the coverage performance for difference in level was good, a sufficient flattening was not achieved but difference of 1.2 µm in level still remained.

Then, the varnish (a) was rotationally coated at the rate of 2,500 rpm on the surface of the silicone resin film and subjected to a heat treatment on a hot plate at the temperature of from 120° C. to 200° C. which was near the melting point of the silicone polymer whereupon the silicone polymer was reflowed. As a result, the silicone polymer flowed to the part having a difference in level whereby the difference in level was able to be almost nil.

After that, a post-baking was carried out at 350° C. for 1 hour in an oven of a nitrogen atmosphere to cure completely.

Then a positive resist for i-line was rotationally coated on the surface thereof to constitute the film thickness about 5 μm and a normal photolithography was carried out to thereby provide a resist layer having a desired pattern such as contact hole, dicing line or the like.

After that, a portion of the resin film which is not protected by the positive resist 4 for i-line, was removed by a dry etching process. Although there is no particular limitation for the dry etching so far as it is a method which does not affect the silicone resin film, a reactive ion etching or an ion beam etching may be preferably used. At this time, the dry etching was carried out by using a reactive ion etching and using a gas having a mixture ratio of $CF_4/O_2$ of 8/2 as the gas for the dry etching. Further, the positive resist 4 for i-line was ashed to remove by oxygen plasma to thereby complete the patterning of the resin film 3.

On the resin film 3 were formed a surge resistance 7 comprising AlSi and fine wiring 6 of magnetic metal showing a magnetoresistance effect and a connecting metal 8 connecting the contact part of the upper layer wiring 2c of control circuit 2 to surge resistance 6 and fine wiring 5. Finally, there was formed a passivation film 9 comprising silicone nitride film or the like for protecting the surge resistance 7 and the fine wiring 6.

When sensor characteristic evaluation and durability test were carried out, there were achieved sensor characteristic and durability which were same as or more than the case where formation was made on a flat substrate. As a result of formation of a sensing portion and a surge resistance on a control circuit as such, chip size was able to be made small and, at the same time, pattern shape of sensor element was able to be freely designed within a range of the size of the chip. Further, it was proved that, due to electric field generated in the layered surge resistance, neither malfunction of the control circuit nor deterioration of the sensor characteristic was detected and that withstand voltage of the flattened film material was sufficiently high. When the sensing portion and the surge resistance were simultaneously layered on the control circuit as such, it was possible to make the sensor element significantly small.

Deterioration of the sensor characteristic caused by the positional shift of surge resistance 7 and fine wiring 6 comprising magnetic metal was not observed as well.

EXAMPLE 3

FIG. 2F is a cross-sectional view illustrating the structure of the magnetoresistance sensor of Example 3 according to the present invention. Formation of multiple layers of silicone resin film and photocured silicone resin film as resin films 13 on the surface of interlayer insulating film 2d of control circuit 2 constituted by bipolar IC was carried out as follows.

Firstly, there were prepared a varnish (a) where a silicone polymer of the formula (2) in which all of the side chains $R_1$ and $R_2$ were methyl group and terminal $R_3$ to $R_6$ were hydrogen and a weight-average molecular weight was 50,000 was dissolved in methanol to make the concentration 15% by weight; another varnish (b) where a silicone ladder polymer of the formula (2) in which 20 mol. % of the side chains $R_1$ and $R_2$ were methacryloylpropyl group and residues were phenyl group while terminal $R_3$ to $R_6$ were methyl group and a weight-average molecular weight was 300,000 was dissolved in methoxybenzene to make the concentration 10% by weight followed by adding 0.5% by weight (to the polymer) of 2,6-bis(4'-azidebenzal)methylcyclohexanone; and an aqueous solution (c) containing 1% by weight of γ-(acryloxypropyl)trimethoxysilane.

The aqueous solution (c) for reinforcing a close adhesion was rotationally coated at the rate of 2,000 rpm on the substrate in which a control circuit having a maximum difference in level of 2.5 μm was formed. It is subjected to a heat treatment on a hot plate at 110° C. for 2 minutes. After that, the varnish (a) was rotationally coated thereon at the rate of 2,000 rpm, subjected to a heat treatment on a hot plate for 5 minutes at 120° C. near the melting point of this silicone polymer to reflow the resin film and post-baked at 375° C. for 1 hour in an oven to form the first layer of a silicone resin film having a thickness of 1.2 μm. Although the filling-in property was good and it is flattened to some extent, the rectangular shape of the edge part of the area having a difference in level still remained. After that, the varnish (b) was rotationally coated thereon at the rate of 3,000 rpm to make the film thickness about 3 μm and subjected to a heat treatment on a hot plate at 135° C. to form the second layer of the silicone resin film. As a result of coating of the two layers, the difference in level became 10% or less of the initial stage. This was further subjected to a contact exposure to ultraviolet ray from an ultrahigh pressure mercury lamp at the output of 500 mJ/cm² by passing through a photomask having the desired pattern such as contact hole and dicing line.

After that, the unexposed portion was removed by dissolving in a developer of methoxybenzene/xylene=1/4 (ratio by volume) and washed with xylene to thereby finish patterning of the silicone resin film. Then, a post-baking was carried out in an oven under a nitrogen atmosphere at 250° C. for 1 hour to completely cure the film and the pattern of the second layer of the silicone resin film was formed.

After that, the first layer of the silicone resin film and the interlayer insulating film were continuously removed by a dry etching using the pattern of the silicone resin film as a mask. Although there is no limitation for the dry etching method so far as it is a method which dose not affect the silicone resin film, reactive ion etching or ion beam etching may be preferably used. At this time, the dry etching was carried out by using a reactive ion etching and using a gas having a mixture ratio of $CF_4/O_2/Ar$ of 5/3/2 as the gas for the dry etching. As such, the pattern formation of the resin film having a two-layered structure was completed.

Then, as same as in Example 2, fine wiring 6, surge resistance 7, connecting metal 8 and passivation film 9 were formed on the resin film 13 to prepare a magnetoresistance sensor element.

Sensor characteristic and durability of the magnetoresistance sensor element were tested and there were obtained the sensor characteristic and the durability which were same as or better than those formed on a flat substrate. As such, in Example 3, the same effect as in Example 2 is achieved and a step of formation of resist pattern can be eliminated whereupon that is able to contribute to simplification of the process and to making the cost low.

Since a process can be skipped, it can contribute to simplification of a process and reduction of cost.

Industrial applicability

As mentioned above, the sensor element according to the present invention is suitable for achieving the improvement in reliability of sensor element and is suitable to be used as, for example, a magnetoresistance sensor, an air flow sensor, an acceleration sensor, a pressure sensor, a yaw rate sensor and an image sensor.

What is claimed is:

1. A magnetoresistance sensor comprising:
a sensor substrate;
a control circuit for the magnetoresistance sensor, disposed on the sensor substrate;
a resin film on the control circuit, the resin film including a plurality of cured polymer layers of different curable polymers, including a layer of a cured polymer film comprising a silicone polymer having a weight-average molecular weight of not less than 100,000 and a layer of a cured polymer film comprising a silicone polymer having a weight-average molecular weight of not more than 100,000; and
a sensing portion having a microfine wiring pattern and disposed on the resin film.

2. A method of fabricating a sensor element, comprising:
applying a solution including a thermosetting polymer to a sensor substrate to form a curable polymer film;
heating the curable polymer film to a temperature not lower than a fusing temperature and lower than a curing temperature of the thermosetting polymer so that the curable polymer film flows on the sensor substrate;
heating the curable polymer film to a temperature not lower than the curing temperature to cure the curable polymer and form a resin film; and
forming a sensor element on the resin film.

3. The method of fabricating a sensor element according to claim 2, wherein the thermosetting polymer is selected from the group consisting of a silicone polymer, a polyimide polymer, a polyimide silicone polymer, a polyarylene ether polymer, a bisbenzocyclobutene polymer, a polyquinoline polymer, a perfluorohydrocarbon polymer, a fluorocarbon polymer, and an aromatic hydrocarbon polymer.

4. An air flow sensor comprising:
a silicon substrate;
a supporting film on the silicon substrate;
a resin film on the supporting film; and
a sensing portion, including a microfine wiring pattern, on the resin film.

5. The air flow sensor according to claim 4, wherein the resin film is a cured polymer film of a curable polymer selected from the group consisting of silicone polymers, polyimide polymers, polyimide silicone polymers, polyarylene ether polymers, bisbenzocyclobutene polymers, polyquinoline, perfluorohydrocarbon, fluorocarbon polymers, and aromatic hydrocarbon polymers.

6. The air flow sensor according to claim 5, wherein the curable polymer is a photo-curing polymer.

7. The air flow sensor according to claim 5, wherein the resin film comprises plural layers and each of the layers comprises a cured polymer film of a differently curable polymer.

8. The air flow sensor according to claim 7, wherein each of the layers comprises a cured film of a curable polymer having a respective, different molecular weight.

9. The air flow sensor according to claim 8, wherein the layers include a layer of a cured polymer film comprising a silicone polymer having a weight-average molecular weight of not less than 100,000 and a layer of a cured polymer film comprising a silicone polymer having a weight-average molecular weight of not more than 100,000.

10. The air flow sensor according to claim 7, wherein an uppermost layers comprises a cured polymer film of a photo-curing polymer.

11. The airflow sensor according to claim 4, wherein the resin film is a cured film of a silicone polymer represented by the general formula

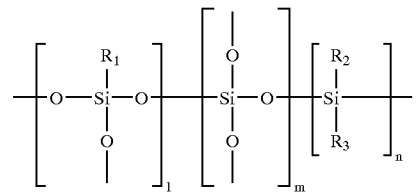

wherein $R_1$, $R_2$, and $R_3$ may be the same or different, are selected from the group consisting of an aryl group, a hydrogen atom, an aliphatic alkyl group, a hydroxyl group, a trialkylsilyl group, and a functional group having an unsaturated bond, l, m, and n are integers and $l+m+n \leq 1$, and the silicone polymer has a weight-average molecular weight of not less than 1,000.

12. The air flow sensor according to claim 4, wherein the film is a cured film of a silicone polymer represented by the general formula

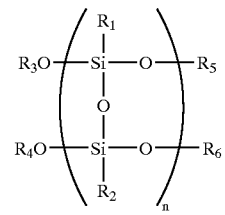

where $R_1$ and $R_2$ may be the same or different, and are selected from the group consisting of an aryl group, a hydrogen atom, an aliphatic alkyl group, and a functional group having an unsaturated bond, $R_3$, $R_4$, $R_5$, and $R_6$ may be the same or different, and are selected from the group consisting of a hydrogen atom, an aryl group, an aliphatic alkyl group, a trialkylsilyl group, and a functional group having an unsaturated bond, and n is an integer and at least 1, and the silicone polymer has a weight-average molecular weight of not less than 1,000.

* * * * *